(12) United States Patent
Teng et al.

(10) Patent No.: US 7,220,486 B2
(45) Date of Patent: May 22, 2007

(54) PHOTORESIST COMPOSITIONS

(75) Inventors: Gary Ganghui Teng, Northboro, MA (US); Gary N. Taylor, Northboro, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/377,165

(22) Filed: Mar. 1, 2003

(65) Prior Publication Data

US 2003/0219603 A1    Nov. 27, 2003

Related U.S. Application Data

(60) Provisional application No. 60/361,123, filed on Mar. 1, 2002.

(51) Int. Cl.
| | | |
|---|---|---|
| *B32B 27/06* | (2006.01) | |
| *B32B 27/18* | (2006.01) | |
| *B32B 27/30* | (2006.01) | |
| *B32B 27/38* | (2006.01) | |

(52) U.S. Cl. .................. 428/413; 428/421; 428/522; 428/698; 430/272.1; 430/280.1

(58) Field of Classification Search ............ 430/270.1, 430/272.1, 910, 905, 280.1; 428/421, 522, 428/698, 413
See application file for complete search history.

(56) References Cited

U.S. PATENT DOCUMENTS

| 3,772,102 | A | * | 11/1973 | Tiemann et al. ............ 430/323 |
|---|---|---|---|---|
| 4,587,196 | A | * | 5/1986 | Toukhy ...................... 430/192 |
| 5,879,856 | A | | 3/1999 | Thackeray et al. |
| 5,945,248 | A | | 8/1999 | Nitta et al. |
| 5,968,712 | A | | 10/1999 | Thackeray et al. |
| 6,300,035 | B1 | | 10/2001 | Thackeray et al. |
| 6,306,554 | B1 | | 10/2001 | Barclay et al. ........... 430/270.1 |
| 6,319,655 | B1 | * | 11/2001 | Wong et al. ................ 430/311 |
| 6,387,589 | B1 | | 5/2002 | Koh et al. |
| 6,509,134 | B2 | * | 1/2003 | Ito et al. .................. 430/270.1 |
| 6,607,870 | B2 | | 8/2003 | Thackeray et al. |
| 6,680,159 | B2 | | 1/2004 | Barclay et al. |
| 6,692,888 | B1 | | 2/2004 | Barclay et al. |
| 2002/0037472 | A1 | | 3/2002 | Zampini et al. ......... 430/270.1 |
| 2002/0055061 | A1 | | 5/2002 | Taylor et al. ............ 430/270.1 |
| 2002/0058198 | A1 | | 5/2002 | Klauck-Jacobs et al. . 430/270.1 |
| 2002/0058199 | A1 | | 5/2002 | Zampini et al. ......... 430/270.1 |
| 2002/0081499 | A1 | | 6/2002 | Zampini et al. ............... 430/5 |
| 2003/0036016 | A1 | | 2/2003 | Szmanda et al. ........ 430/270.1 |
| 2003/0219603 | A1 | | 11/2003 | Teng et al. ................. 428/414 |

FOREIGN PATENT DOCUMENTS

| EP | 0 789 279 A1 | 8/1997 |
|---|---|---|
| EP | 0 843 220 A1 | 5/1998 |
| EP | 0 848 290 A1 | 6/1998 |
| EP | 1 048 983 A1 | 11/2000 |
| WO | WO 00/67072 | 11/2000 |
| WO | WO 01/37047 A2 | 5/2001 |
| WO | WO 01/86353 A1 | 11/2001 |

* cited by examiner

*Primary Examiner*—Ramsey Zacharia
(74) *Attorney, Agent, or Firm*—Peter F. Corless; Darryl P. Frickey; Edwards Angell Palmer & Dodge LLP

(57) ABSTRACT

New photoresists are provided that are suitable for short wavelength imaging, including sub-300 nm and sub-200 nm such as 193 nm and 157 nm. Photoresists of the invention contain a resin with photoacid-labile groups, one or more photoacid generator compounds, and an adhesion-promoting additive compound. Photoresists of the invention can exhibit significant adhesion to SiON and other inorganic surface layers.

11 Claims, 2 Drawing Sheets

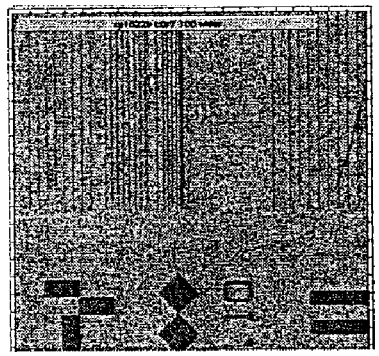
FIG. 1A (Photoresist 1)
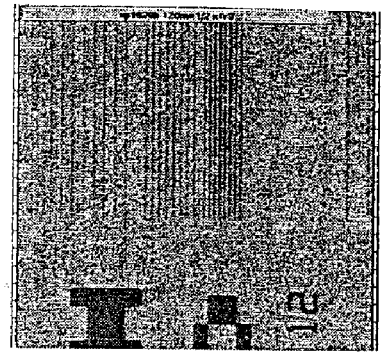
FIG. 1B (Photoresist 2)
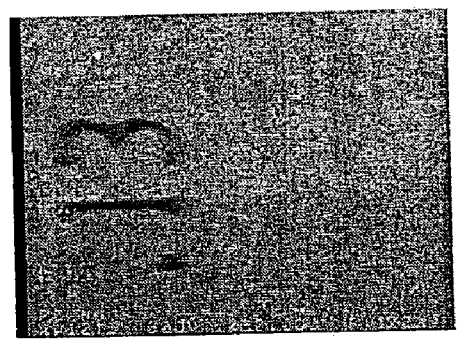
FIG. 1C (Photoresist 3)

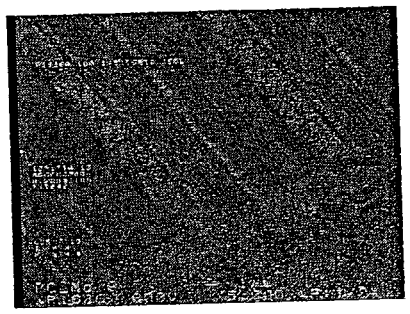 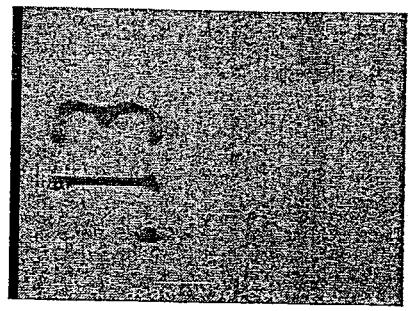
FIG. 2A (Photoresist 4)    FIG. 2B (Photoresist 5)

PHOTORESIST COMPOSITIONS

This application claims benefit of U.S. provisional application Ser. No. 60/361,123 filed on Mar. 1, 2002.

BACKGROUND OF THE INVENTION

1. Field of the Invention

The present invention relates to new photoresist compositions that are suitable for short wavelength imaging, including sub-300 nm and sub-200 nm such as 248 nm, 193 nm and 157 nm. Photoresists of the invention can exhibit significant adhesion to SiON and other inorganic surface layers. Preferred photoresists of the invention contain a resin with photoacid-labile groups, one or more photoacid generator compounds, and an adhesion-promoting additive compound.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble.

While currently available photoresists are suitable for many applications, current resists also can exhibit significant shortcomings, particularly in high performance applications such as formation of highly resolved sub-quarter micron and sub-tenth micron features.

Consequently, interest has increased in photoresists that can be photoimaged with short wavelength radiation, including exposure radiation of below 300 nm such as 248 nm, or even 200 nm or less such as 193 nm. Quite recently, $F_2$ excimer laser imaging, i.e. imaging with radiation having a wavelength of about 157 nm, has been considered as a route to manufacture of even smaller features. See, generally, Kunz et al., SPIE Proceedings (Advances in Resist Technology), vol. 3678, pages 13–23 (1999).

Silicon oxynitride (SiON) layers and other inorganics such as $Si_3N_4$ coatings have been employed in semiconductor device manufacture, for example as an etch stop layer and an inorganic antireflective layer. See, for instance, U.S. Pat. Nos. 6,124,217; 6,153,504; and 6,245,682.

It would be desirable to have new photoresist compositions that could be imaged at short wavelengths such as sub-300 nm and sub-200 nm. It would be particularly desirable to have such photoresists that would provide good resolution on SiON and other inorganic substrate layers.

SUMMARY OF THE INVENTION

Novel photoresist compositions are provided that comprise an adhesion-promoting component, a resin that contains photoacid-labile groups, and one or more photoacid generator compounds. Preferred resists of the invention are useful for short-wavelength imaging, including sub-300 nm and sub-200 nm wavelengths such as 248 nm, 193 nm and 157 nm.

The adhesion-promoting component (generally referred to herein as "adhesion-promoting component" or "adhesion-promoting additive") suitably has one or more moieties that can impart enhanced adhesion of a coating layer of a photoresist containing the component to an underlying substrate, including a SiON layer.

We have found that organic antireflective materials may have limited applications at extremely short imaging wavelengths such as sub-170 nm, particularly 157 nm. At such short wavelengths, the antireflective layer is optimally quite thin (e.g. ≦30 nm layer thickness). Current organic antireflective compositions have not provided sufficient absorbance at such layer thicknesses. Hence, inorganic antireflective materials such as SiON and $Si_3N_4$ appear to have greater potential as an antireflective undercoat for sub-170 nm imaging such as 157 nm.

We also have found however that prior photoresists can adhere relatively poorly to such inorganic surface coatings, resulting in reduced resolution of a patterned image.

We have now found that photoresists of the invention can adhere well to such inorganic surface layers, including SiON layers. See, for instance, the comparative data of the examples, which follow.

The term adhesion-promoting component or additive refers to herein a compound that is incorporated into a resist polymer and provides a discernable increase in adhesion of the resist to a SiON surface layer. A discernable increase in adhesion is indicated by enhanced resolution relative to a control resist (same resist processed in same manner, but resist does not contain the adhesion-promoting component). Such enhanced resolution is determined by visual inspection of scanning electron micrographs (SEMs) of the resist with candidate adhesion-promoting component (test resist) and the control resist. See, for instance, the clearly discernable difference between the SEMs of FIGS. 1A, 1B and 1C and between the SEMs of FIGS. 2A and 2B. Thus, a suitable adhesion-promoting component for any given resist system can be readily identified empirically. Preferred adhesion-promoting components or additives are disclosed in detail herein.

Without being bound by any theory, it is believed that at least some of the preferred adhesion-promoting additives in a resist of the invention may interact with reactive groups of an inorganic surface layer such as e.g. —H—N, —Si—H, —Si—OH, and —COOH groups of SiON and $Si_3N_4$ coating layers during pre-exposure (soft bake) and/or post exposure thermal treatments of an overcoated photoresist layer, thereby providing a thin organic layer or at least organic sites on the inorganic layer and allowing improved adhesion to the overcoated organic resist.

Preferred adhesion-promoting components for use in resists of the invention will contain one or more moieties that can react or at least complex with a SiON and $Si_3N_4$ substrate layer. Such complexing or reaction can occur during lithographic processing of a photoresist containing the adhesion-promoting additive that is overcoated the SiON and $Si_3N_4$ layer, e.g. during pre-exposure and/or post-exposure thermal treatments, or during exposure, or otherwise during processing of the resist to provide a resist relief image.

Particularly preferred moieties of an adhesion-promoting component include epoxy groups and nitrogen ring groups. Suitable nitrogen ring moieties include non-aromatic ring groups that have 1 to 3 nitrogen ring atoms and from 4 to about 8 total ring atoms such as an optionally substituted azole, optionally tetrazole, optionally substituted triazole, optionally substituted imidazole, and optionally substituted benzotriazole.

In one aspect, preferred adhesion-promoting components for use in a resist of the invention are suitably of low molecular weight, e.g. a molecular weight of less than about 1,500 daltons, more preferably a molecular of less than about 1,000 daltons, and suitably a molecular weight of less than about 700 or 500 daltons.

In such aspects, the adhesion-promoting components also may be non-polymeric, i.e. not contain multiple repeat units.

In other aspects of the invention, the adhesion-promoting additive may be suitably polymeric, e.g. contain multiple repeat units with epoxy groups and the like. In such aspects of the invention, the adhesion-promoting additive suitably may have relatively higher molecular weights, e.g. a molecular weight in excess of 1,000 or 1,500 daltons. Such polymeric additives however preferably will not have a weight average molecular weight in excess of about 3,000, 4,000, 5,000 or 10,000 daltons.

Preferably, the adhesion-promoting component will be stable in a photoresist composition and not interfere with lithographic processing of the resist. That is, the additive component preferably does not promote premature degradation of a resist (i.e. reduced shelf life) or necessitate alternate lithographic processing conditions.

The adhesion-promoting additive typically will be a further, distinct resist component beyond prior resist components of e.g. an photoacid-labile or deblocking resin, photoacid generator, basic additive, surfactant/leveler, plasticizer, and/or solvent. Thus, preferred adhesion-promoting additives for use in a resist will not contain photoacid-labile moieties such as a photoacid-labile ester or acetal groups that undergo a deblocking reaction as a consequence of a photoresist exposure step.

However, the adhesion-promoting additive may provide other function to a resist composition, such as provide or enhance solvency of solid components. However, unlike other volatile solvents, an adhesion-promoting additive will remain in a resist layer in effective amounts after any pre-exposure thermal treatment, e.g. preferably at least about 10, 20, 30, 40, or 50 mole percent of the amount of the adhesion-promoting additive formulated in the liquid resist composition will remain in the resist composition after any pre-exposure thermal treatment. Typically, only a small amount of the adhesion-promoting additive need remain in a resist coating layer after any thermal treatments to achieve effective results, e.g. the adhesion-promoting additive may be suitably present in an amount of from about 0.05 or 0.1 weight percent to about 5 weight percent of total material of the resist layer after volatile solvent removal.

The deblocking resin component of a photoresist of the invention suitably contains one or more photoacid-labile repeat units, e.g. photoacid-labile ester or acetal groups that will provide solubility differentials between exposed and unexposed regions of a resist coating layer upon development. Generally preferred photoacid-labile resins are copolymers, i.e. have two or more distinct repeat units. Higher order polymers are typically preferred, including terpolymers (three distinct repeat units), tetrapolymers (four distinct repeat units), and pentapolymers (five distinct repeat units). As used herein, the term "copolymer" is inclusive of polymers having two distinct repeat units as well as higher order polymers, i.e. polymers that have more than two distinct repeat units such as terpolymers, tetrapolymers, pentapolymers, etc.

It is also preferred that the photoacid-labile polymer has fluorine substitution, e.g. as may be provided by polymerization of a fluorinated monomer such as tetrafluoroethylene. The additive-promoting additive also may be suitably fluoro-substituted.

The repeat units of a photoacid-labile polymer used in a resist of the invention may suitably vary depending on the exposure wavelength used for imaging the resist. More particularly, for resist to be imaged at wavelengths greater than 200 nm, the resin may suitably contain aromatic units, particularly optionally substituted phenyl units, preferably phenolic units such as provided by polymerization of a vinylphenol. For resists to be imaged with radiation having a wavelength of less than 200 nm such as 193 nm or 157 nm, the resin suitably may be substantially, essentially or completely free of any phenyl or other aromatic units. A resin that is substantially free of aromatic units has less than about 5 mole percent aromatic units based on total resin units, preferably less than about 4, 3, 2, 1 or 0.5 mole percent aromatic units based on total resin units.

The invention also includes substrates coated with a photoresist as disclosed herein, including substrates having an inorganic surface coating such as a SiON or $Si_3N_4$ coating.

Methods for forming relief images also are provided, including methods for forming a highly resolved relief image such as a pattern of lines (dense or isolated) where each line has vertical or essentially vertical sidewalls and a line width of about 0.25 microns or less, or even about 0.10 microns or less. In such methods, preferably a coating layer of a resist of the invention is imaged with short-wavelength radiation, particularly sub-300 or sub-200 nm radiation, especially 248 nm, 193 nm, and 157 nm radiation, and higher energy radiation such as radiation having a wavelength of less than 100 nm, EUV, electron beam, ion beam or x-ray imaging.

The invention further comprises articles of manufacture comprising substrates such as a microelectronic wafer having coated thereon the photoresists and relief images of the invention. Methods for producing such articles of manufacture also are providing, which generally comprise use of a photoresist of the invention.

Other aspects of the invention are disclosed infra.

BRIEF DESCRIPTION OF THE DRAWINGS

FIG. 1 (which includes FIGS. 1A, 1B and 1C) shows scanning electron micrographs (SEMs) of lithographic results of Example 1 which follows.

FIG. 2 (which includes FIGS. 2A and 2B) shows scanning electron micrographs (SEMs) of lithographic results of Example 2 which follows.

DETAILED DESCRIPTION OF THE INVENTION

As discussed above, we now provide new photoresist compositions that comprise a deblocking resin, a photoacid generator compound, and a compound that has one or more moieties that provide enhanced adhesion to an underlying substrate, particularly inorganic coating layers such as those SiON and $Si_3N_4$.

Preferably those resist materials will be present as separate components within the resist composition, i.e. the photoacid-labile polymer, the photoacid generator and the adhesion-promoting additive will be separate, non-covalently linked materials of the resist.

A variety of materials may be used as an adhesion-promoting additive of a resist of the invention. Also, in addition to the materials specifically identified herein, further suitable materials can be identified by simple testing as discussed above, i.e. a candidate adhesion-promoting additive can be added to a photoresist composition and that resist evaluated for enhanced adhesion (as may be shown by enhanced lithographic patterning) to a SiON or $Si_3N_4$ substrate surface relative to the adhesion of the same resist without the additive. Such testing is demonstrated in the comparative examples which follow. In general, enhanced adhesion of a resist layer to a SiON or other inorganic substrate may be assessed by the resolution of the overcoated resist layer.

As discussed above, suitable adhesion-promoting additives include materials having one or more epoxide moieties. Suitable epoxide compounds include saturated compounds, e.g. optionally substituted alkyl and cycloalkyl (alicyclic) compounds suitably having 1 to about 25 carbon atoms, more typically 3 to about 18 carbon atoms and at least one epoxide moiety e.g. 1, 2, 3 or 4 epoxide moieties. The compounds also may have a variety of substituents in addition to epoxy such as halo (F, Cl, Br, I) particularly fluoro; haloalkyl particularly halo($C_{1-10}$alkyl) especially fluoro($C_{1-10}$alkyl) such as —$CF_3$, —$CH_2CF_3$ and the like; carboxy; alkanoyl such as formyl, acetyl and other $C_{1-12}$alkanoyl; hydroxy, nitro; alkoxy such as $C_{1-12}$alkoxy, alkylthio such as $C_{1-12}$alkylthio; etc. Aromatic compounds, such as phenyl compounds, having epoxide substitution also can be suitable adhesion-promoting additives.

Exemplary suitable epoxy-containing adhesion-promoting additives for use in a resist of the invention include e.g. furfuryl glycidyl ether, bisphenol A diglycidyl ether, N-(2,3-epoxypropyl)phthalimide, 3,4-epoxytetrahydrothiophene-1,1-dioxide, 1,2-epoxydodecane, heptafluoropropyloxirane, tetrafluoro-(2-heptafluoropropoxy) propyloxirane, etc.

Exemplary suitable cyclic nitrogen adhesion-promoting additives for use in a resist of the invention include optionally substituted azole groups, including optionally substituted tetrazole, optionally substituted triazole, optionally substituted benzotriazole, and optionally substituted benzothiadiazole. Specifically suitable compounds of this type include 2,5-dimercapto-1,3-4,-thiadiazole, benzotriazole, 1-H-benzotriazole-1-carboxaldehyde, 1H-benzotriazole-1-acetonitrile, 1H-benzotriazole-1-methanol, 3-(2H-benzotriazole-2-yl)-4-hydroxyphenethyl alcohol, and 1H-benzotriazole-5-carboxylic acid.

Other suitable adhesion-promoting additives for use in a resist of the invention include aromatic compounds having carboxyl (—COOH) and hydroxy (—OH) substitution such as a salicyclic acid, and the like.

Suitably one or more adhesion-promoting additives will be present in a photoresist composition in an amount of at least about 0.1 weight percent based on total solids of the resist composition (all components except conventional solvent), more preferably from about 1 to about 5 or 10 weight percent based on total solids of a resist composition, still more preferably at least about 1, 2, 3, 4, or 5 weight percent based on total solids of a photoresist composition.

As discussed above, the photoacid-labile polymer component will contain one or more repeat units that comprise a photoacid-labile moiety, such as a photoacid-labile ester or acetal group. Particularly preferred photoacid-labile groups are discussed below.

Preferably, the photoacid-labile polymer has fluorine substitution. Preferred fluorine-containing units of the photoacid-labile polymer are suitably derived from at least one ethylenically unsaturated compound. Preferably, such a fluorine substituent is separated from the unsaturated carbons by at least one saturated carbon in order to not unduly inhibit the polymerization reaction. Such fluorinated units may be provided by e.g. polymerization of tetrafluoroethylene, chlorotrifluoroethylene, hexafluoropropylene, trifluoroethylene, vinylidene fluoride, vinyl fluoride, and the like.

Exemplary preferred unsaturated compounds for synthesis of polymers, particularly photoacid-labile polymers, utilized in resists of the invention include the following of Formulae (A), (B), (C) and (D):

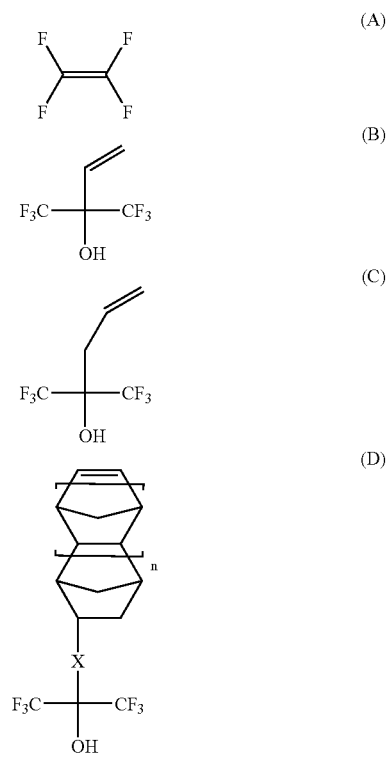

wherein in Formulae (D), X is a linker, preferably —$CH_2$—, —$CH_2OCH_2$—, or —$OCH_2$—; and n is 0 or 1.

Additional preferred monomers for use in a photoacid-labile polymer of a resist of the invention may comprise a group of the following formula:

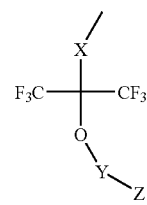

wherein X is a linker, preferably —CH$_2$—, —CH$_2$OCH$_2$—, or —OCH$_2$—

Y is hydrogen, a chemical bond linking the oxygen and group Z, (—CH$_2$—)p where p is 1 or 2, —CH$_2$O—, or CHRO— where R is C$_{1-16}$alkyl, preferably C$_{1-4}$alkyl; and Z is alkyl preferably having 1 to about 20 carbon s and including tri(C$_{1-6}$)alkylmethyl; tetrahydropyranyl; or tetrahydrofuranyl;

and preferably X is —OCH$_2$—; preferably Y is a bond or —CH$_2$O—; and preferably Z is t-butyl, methyl, tetrahydropyranyl or tetrahydrofuranyl.

Preferred photoacid-labile groups of a resin used in a resist of the invention include photoacid-labile acyclic (aliphatic) esters such as a tert-butyl ester, or an ester containing a tertiary alicyclic group. Such photoacid-labile esters may be directly pendant from the resin backbone or other polymer unit such as a carbon alicyclic, heteroalicyclic or other polymer unit (e.g. where the photoacid-labile group is of the formula —C(=O)OR, where R is tert-butyl or other non-cyclic alkyl group, or a tertiary alicyclic group and is directly linked to the polymer backbone or unit), or the ester moieties may be spaced from the polymer backbone or other polymer unit, e.g. by an optionally substituted alkane linkage (e.g. —(CH$_2$)$_{0-2}$C(=O)OR, where R is tert-butyl or other non-cyclic alkyl group, or a tertiary alicyclic group). Such photoacid-labile groups also suitably may contain fluorine substitution at available positions.

Preferred photoacid-labile tertiary alicyclic hydrocarbon ester moieties are polycyclic groups such adamantyl, ethylfencyl or a tricyclo decanyl moiety. References herein to a "tertiary alicyclic ester group" or other similar term indicate that a tertiary alicyclic ring carbon is covalently linked to the ester oxygen, i.e.—C(=O)O—TR' where T is a tertiary ring carbon of alicyclic group R'. In at least many cases, preferably a tertiary ring carbon of the alicyclic moiety will be covalently linked to the ester oxygen. However, the tertiary carbon linked to the ester oxygen also can be exocyclic to the alicyclic ring, typically where the alicyclic ring is one of the substituents of the exocyclic tertiary carbon. Typically, the tertiary carbon linked to the ester oxygen will be substituted by the alicyclic ring itself, and/or one, two or three alkyl groups e.g. having 1 to about 12 carbons, more typically 1 to about 8 carbons, even more typically 1, 2, 3 or 4 carbons. The alicyclic group also preferably will not contain aromatic substitution. The alicyclic groups may be suitably monocyclic, or polycyclic, particularly bicyclic or tricyclic groups.

Preferred alicyclic moieties (e.g. group TR' of —C(=O) O—TR') of photoacid labile ester groups of polymers of the invention have rather large volume. It has been found that such bulky alicyclic groups can provide enhanced resolution when used in copolymers of the invention.

More particularly, preferred alicyclic groups of photoacid labile ester groups will have a molecular volume of at least about 125 or about 130 Å$^3$, more preferably a molecular volume of at least about 135, 140, 150, 155, 160, 165, 170, 175, 180, 185, 190, 195, or 200 Å$^3$. Alicyclic groups larger than about 220 or 250 Å$^3$ may be less preferred, in at least some applications. References herein to molecular volumes designate volumetric size as determined by standard computer modeling, which provides optimized chemical bond lengths and angles. A preferred computer program for determining molecular volume as referred to herein is Alchemy 2000, available from Tripos. For a further discussion of computer-based determination of molecular size, see T Omote et al, *Polymers for Advanced Technologies*, volume 4, pp. 277–287.

Particularly preferred tertiary alicyclic groups of photoacid-labile units include the following, where the wavy line depicts a bond to the carboxyl oxygen of the ester group, and R is suitably optionally substituted alkyl, particularly C$_{1-6}$ alkyl such as methyl, ethyl, etc.

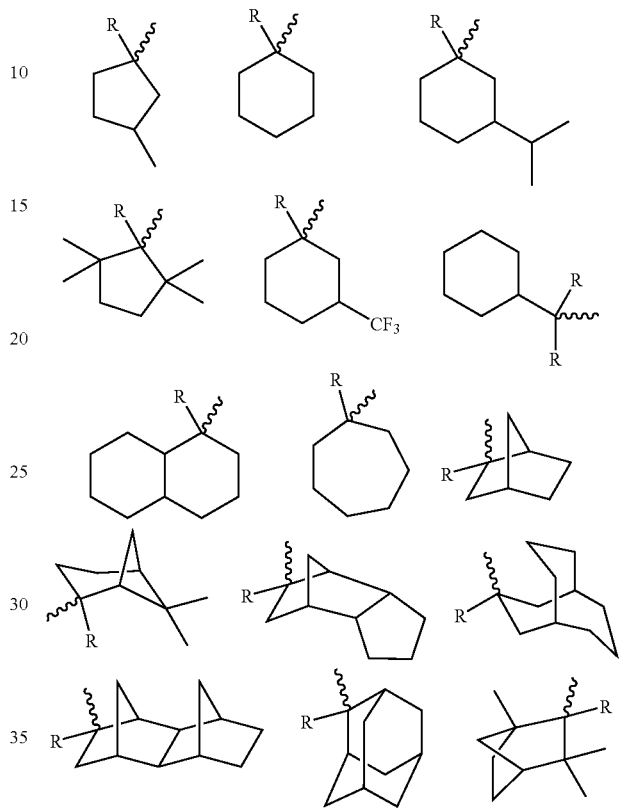

As also indicated above, photoacid-labile polymers may contain photoacid-labile groups that do not contain an alicyclic moiety. For example, polymers of the invention may contain photoacid-labile ester units, such as a photoacid-labile alkyl ester. Generally, the carboxyl oxygen (i.e. the carboxyl oxygen as underlined as follows: —C(=O)O) of the photoacid-labile ester will be covalently linked to the quaternary carbon. Branched photoacid-labile esters are generally preferred such as t-butyl and —C(CH$_3$)$_2$CH (CH$_3$)$_2$.

In this regard, photoacid-labile polymers used in resists of the invention may contain distinct photoacid-labile groups, i.e. the polymer may contain two or more ester groups that have distinct ester moiety substitutions e.g. one ester may have an alicyclic moiety and another ester may have an acyclic moiety such as t-butyl, or the polymer may contain both ester and other functional groups that are photoacid-labile such as acetals, ketals and/or ethers.

Photoacid-labile polymers used in resists of the invention also may contain additional units.

Suitable polymers for use in the resists of the invention also are disclosed in e.g. U.S. Pat. Nos. 6,306,554; 6,300, 035; and 6,165,674, all assigned to the Shipley Company. Those described polymers would be modified in accordance with the invention by incorporating an adhesion-promoting repeat unit in the described polymers. The polymers disclosed in U.S. Pat. Nos. 6,306,554 and 6,165,674 would be preferred for sub-200 nm imaging, and the polymers described in U.S. Pat. No. 6,300,035 would be preferred for imaging at longer wavelengths such as 248 nm.

As discussed, various polymer and additive components may be optionally substituted. A "substituted" substituent may be substituted at one or more available positions, typically 1, 2, or 3 positions by one or more suitable groups such as e.g. halogen (particularly F); cyano; $C_{1-6}$alkyl; $C_{1-6}$alkoxy; $C_{1-6}$alkylthio; $C_{1-6}$alkylsulfonyl; $C_{2-6}$alkenyl; $C_{2-6}$alkynyl; hydroxyl; nitro; alkanoyl such as a $C_{1-6}$alkanoyl e.g. acyl and the like; etc.

Polymers of the invention can be prepared by a variety of methods. One suitable method is an addition reaction which may include free radical polymerization, e.g., by reaction of selected monomers to provide the various units as discussed above in the presence of a radical initiator under an inert atmosphere (e.g., $N_2$ or argon) and at elevated temperatures such as about 70° C. or greater, although reaction temperatures may vary depending on the reactivity of the particular reagents employed and the boiling point of the reaction solvent (if a solvent is employed). Suitable reaction solvents include e.g. a halogenated solvent such as a fluorinated solvent or a chlorinated solvent and the like. Suitable reaction temperatures for any particular system can be readily determined empirically by those skilled in the art based on the present disclosure. A variety of free radical initiators may be employed. For example, azo compounds may be employed such as azo-bis-2,4-dimethylpentanenitrile. Peroxides, peresters, peracids and persulfates also could be employed.

Other monomers that can be reacted to provide a polymer of the invention can be identified by those skilled in the art. For example, to provide photoacid-labile units, suitable monomers include e.g. methacrylate or acrylate that contains the appropriate group substitution (e.g. tertiary alicyclic, t-butyl, etc.) on the carboxy oxygen of the ester group. Suitable acrylate monomers with tertiary alicyclic groups for synthesis of polymers useful in the resists of the invention also are disclosed in U.S. Pat. No. 6,306,554 to Barclay et al.

Resist compositions of the invention also comprise one or more photoacid generators (i.e. "PAG") that are suitably employed in an amount sufficient to generate a latent image in a coating layer of the resist upon exposure to activating radiation. Preferred PAGs for imaging at 157 nm, 193 nm and 248 nm imaging include imidosulfonates such as compounds of the following formula:

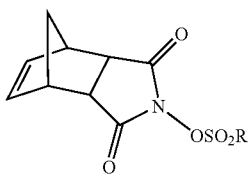

wherein R is camphor, adamantane, alkyl (e.g. $C_{1-12}$ alkyl) and perfluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also suitable PAGs, particularly sulfonate salts. Two suitable agents for 193 nm and 248 nm imaging are the following PAGS 1 and 2:

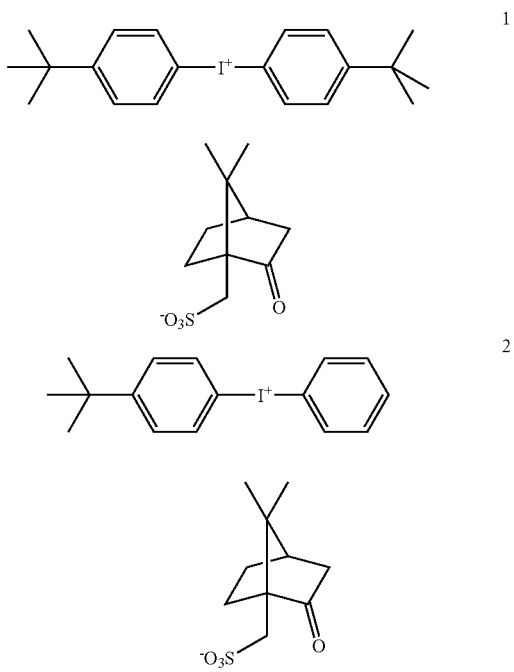

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3$— where R is adamantane, alkyl (e.g. $C_{1-12}$alkyl) and perfluoroalkyl such as perfluoro ($C_{1-12}$alkyl), particularly perfluorooctanesulfonate, perfluorobutanesulfonate and the like.

For imaging at 157 nm, a triphenyl sulfonium PAG is particularly preferred, complexed with anions such as the sulfonate anions mentioned above, particularly a perfluoroalkyl sulfonate such as perfluorobutane sulfonate.

Other known PAGS also may be employed in the resists of the invention. Particularly for 193 nm imaging, generally preferred are PAGS that do not contain aromatic groups, such as the above-mentioned imidosulfonates, in order to provide enhanced transparency.

A preferred optional additive of resists of the invention is an added base, particularly tetrabutylammonium hydroxide lactate, which can enhance resolution of a developed resist relief image. Other suitable added bases include diazabicyclo undecene or diazabicyclononene. The added base is suitably used in relatively small amounts, e.g. about 0.03 to 5 percent by weight relative to the total solids.

Photoresists of the invention also may contain other optional materials. For example, other optional additives include anti-striation agents, plasticizers, speed enhancers, etc. Such optional additives typically will be present in minor concentrations in a photoresist composition.

The resists of the invention can be readily prepared by those skilled in the art. For example, a photoresist composition of the invention can be prepared by dissolving the components of the photoresist in a suitable solvent such as, for example, 2-heptanone, cyclohexanone, ethyl lactate, propylene glycol monomethyl ether; and propylene glycol monomethyl ether acetate. Typically, the solids content of the composition varies between about 2 and 20 percent by weight of the total weight of the photoresist composition. The resin binder and photoactive components should be present in amounts sufficient to provide a film coating layer and formation of good quality latent and relief images. See the examples which follow for exemplary preferred amounts of resist components.

The compositions of the invention are used in accordance with generally known procedures. The liquid coating compositions of the invention are applied to a substrate such as by spinning or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon wafers or silicon wafers coated with silicon dioxide, SiON or $Si_3N_4$ for the production of microprocessors and other microelectronic device substrates.

As discussed above, the photoresists are particularly useful for applying over inorganic surface coatings, including SiON and $Si_3N_4$.

Following coating of the photoresist onto a surface, a resist coating layer is suitably dried by heating to remove the solvent until preferably the photoresist coating is at least essentially free of solvent. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 100 $mJ/cm^2$, dependent upon the exposure tool and the components of the photoresist composition.

As discussed above, coating layers of the resist compositions of the invention are preferably photoactivated by a short exposure wavelength, particularly a sub-300 and sub-200 nm exposure wavelength. 193 nm and 157 nm are preferred exposure wavelength. However, the resist compositions of the invention also may be suitably imaged at higher wavelengths.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as quaternary ammonium hydroxide solutions such as a tetraalkyl ammonium hydroxide solution, preferably a 0.26 N tetramethylammonium hydroxide aqueous solution; or various amine solutions such as a solution containing ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream. After such processing, resist may be removed from the processed substrate using known stripping procedures.

All documents mentioned herein are incorporated herein by reference. The following non-limiting examples are illustrative of the invention.

EXAMPLE 1

Photoresist Preparation and Lithographic Processing

The following Photoresists 1, 2 and 3 were prepared by admixing the specified components in the below-specified amounts. The photoacid-labile polymer was prepared by polymerization of tetrafluoroethylene (TFE) (31 mole percent monomer charging), norbornene substituted with hexafluoro-iso-propanol (46 mole percent monomer charging), and t-butylacrylate (24 mole percent monomer charging).

Photoresists 1 and 2 each contained an adhesion-promoting co-solvent (epoxy compound). Photoresist 3 is a comparative composition, which corresponds to Photoresists 1 and 2, but does not contain an adhesion-promoting additive.

| Material | Weight (g) |
| --- | --- |
| Photoresist 1 (with adhesion-promoting co-solvent) | |
| Photoacid-labile resin: TFE/NB-F-OH/TBA 31/46/24 | 1.417 |
| PAG: Triphenylsulfonium perfluorobutane sulfonate | 0.780 |
| Basis additive: Tetrabutylammonium lactate | 0.360 |
| Surfactant: Perfluorinated surfactant RO8 | 0.300 |
| Solvent: 2-Heptanone | 8.768 |
| Adhesion-promoting co-solvent: Furfuryl glycidyl ether | 3.375 |
| Photoresist 2 (with adhesion-promoting co-solvent) | |
| Photoacid-labile resin: Perfluorinated polymer TFE/NB-F-OH/TBA 31/46/24 | 1.417 |
| PAG: Triphenylsulfonium perfluorobutane sulfonate | 0.780 |
| Basic additive: Tetrabutylammonium lactate | 0.360 |
| Surfactant: Perfluorinated surfactant RO8 | 0.300 |
| Solvent: 2-Heptanone | 8.768 |
| Adhesion-promoting co-solvent: 1,2-Epoxydodecane | 3.375 |
| Photoresist 3 (Comparative) | |
| Photoacid-labile resin: Perfluorinated polymer TFE/NB-F-OH/TBA 31/46/24 | 1.417 |
| PAG: Triphenylsulfonium perfluorobutane sulfonate | 0.780 |
| Basic additive: Tetrabutylammonium lactate | 0.360 |
| Surfactant: Perfluorinated surfactant RO8 | 0.300 |
| Solvent: 2-Heptanone | 12.143 |

The above resists were spin-coated onto an HMDS treated 8" SiON wafer on a Polaris 2000 coating track to achieve a thickness of about 1570 Å and baked at 140° C. for 60 sec. The coated wafer was exposed on an Exitech 157 nm stepper (0.60 NA, 0.70σ) for a lines and spaces test pattern, post-exposure baked at 105° C. for 60 sec. and developed for 60 seconds with an aqueous alkaline developer commercially from the Shipley Company. The developed wafers were evaluated by top-down scanning electron microscope (SEM) for imaging patterns.

The top-down SEM pictures of the lithographic results of each of the tested resists are shown in FIGS. 1A, 1B and 1C. Those SEMS show that Photoresists 1 and 2 that contain an adhesion promoting additive provide lithographic patterns with good adhesion. See FIGS. 1A and 1B. In contrast, the control Photoresist 3 which did not contain an adhesion promoting additive showed complete adhesion failure. See FIG. 1C.

EXAMPLE 2

Photoresist Preparation and Lithographic Processing

The following Photoresists 4 and 5 were prepared by admixing the below specified components in the below-specified amounts. The photoacid-labile polymer was prepared by polymerization of tetrafluoroethylene (TFE) (31 mole percent monomer charging), norbornene substituted with hexafluoro-iso-propanol (46 mole percent monomer charging), and tetrabutylacrylate (24 mole percent monomer charging).

Photoresist 4 contained an adhesion-promoting additive (benzotriazole). Photoresist 5 is a comparative composition, which corresponds to Photoresist 4, but does not contain an adhesion-promoting additive.

| Material | Weight (g) |
| --- | --- |
| Photoresist 4 (with adhesion-promoting additive) | |
| Photoacid-labile resin: TFE/NB-F-OH/TBA 31/46/24 | 1.387 |
| PAG: Triphenylsulfonium perfluorobutane sulfonate | 0.780 |
| Adhesion-promoting additive: Benzotriazole | 0.030 |
| Basic additive: Tetrabutylammonium lactate | 0.360 |
| Surfactant: Perfluorinated surfactant RO8 | 0.300 |
| Solvent: 2-Heptanone | 12.143 |
| Photoresist 5 (Comparative) | |
| Photoacid-labile resin: Perfluorinated polymer TFE/NB-F-OH/TBA 31/46/24 | 1.417 |
| PAG: Triphenylsulfonium perfluorobutane sulfonate | 0.780 |
| Basic additive: Tetrabutylammonium lactate | 0.360 |
| Surfactant: Perfluorinated surfactant RO8 | 0.300 |
| Solvent: 2-Heptanone | 12.143 |

The above resists were spin-coated onto an HMDS treated 8" SiON wafer on a Polaris 2000 coating track to achieve a thickness of about 1570 Å and baked at 140° C. for 60 sec. The coated wafer was exposed on an Exitech 157 nm stepper (0.60 NA, 0.70σ) for a lines and spaces test pattern, post-exposure baked at 105° C. for 60 sec. and developed for 60 seconds with an aqueous alkaline developer commercially available from the Shipley Company. The developed wafers were evaluated by top-down scanning electron microscope (SEM) for imaging patterns.

The top-down SEM pictures are shown in FIGS. 2A and 2B. It is seen that the Photoresist 4 that contains an adhesion-promoting additive provide lithographic patterns with good adhesion. See FIG. 2A. In contrast, the comparative Photoresist 5 shows complete adhesion failure. See FIG. 2B.

The foregoing description of the invention is merely illustrative thereof, and it is understood that variations and modifications can be effected without departing from the spirit or scope of the invention as set forth in the following claims.

What is claimed is:

1. A microelectronic device substrate comprising
   a silicon oxynitride layer,
   a photoresist composition coating layer over the silicon oxynitride layer,
   wherein the photoresist composition comprises a photoacid-labile polymer that comprises aromatic groups, a photoacid generator compound, and an adhesion-promoting component that is a polymer and comprises one or more epoxy moieties.

2. The substrate of claim 1 wherein the adhesion-promotion component can react or complex with the silicon oxynitride layer during lithographic processing of the photoresist composition.

3. The substrate of claim 1 wherein the adhesion-promoting component comprises one or more cyclic nitrogen moieties.

4. The substrate of claim 1 wherein the adhesion-promoting component does not contain a photoacid-labile moiety.

5. The substrate claim 1 wherein the adhesion-promoting component has a molecular weight of about 1,000 daltons to about 1,500 daltons.

6. The substrate of claim 1 wherein the photoacid-labile polymer has fluorine substitution.

7. The substrate of claim 1 wherein the photoacid-liable polymer comprises acrylate repeat units.

8. The substrate of claim 1 wherein the photoacid-liable polymer comprises photoacid-labile acetal or ketal groups.

9. The substrate of claim 1 wherein the photoacid-liable polymer comprises photoacid-labile ester groups.

10. A microelectronic device substrate comprising
    a silicon oxynitride layer,
    a photoresist composition coating layer over the silicon oxynitride layer,
    wherein the photoresist composition comprises (i) a photoacid-labile polymer that comprises aromatic groups and photoacid-labile ester groups, (ii) a photoacid generator compound, and (iii) an adhesion-promoting component that is a polymer and comprises epoxy groups.

11. The substrate of claim 10 wherein the photoacid-liable polymer is a terpolymer.

* * * * *